(12) United States Patent
Cho et al.

(10) Patent No.: US 6,882,226 B2
(45) Date of Patent: Apr. 19, 2005

(54) BROADBAND VARIABLE GAIN AMPLIFIER WITH HIGH LINEARITY AND VARIABLE GAIN CHARACTERISTIC

(75) Inventors: Youngho Cho, Seongnam-si (KR); Bo-Eun Kim, Yongin-si (KR); Bonkee Kim, Yongin-si (KR)

(73) Assignee: Integrant Technologies Inc., Seongnam-si (KR)

( * ) Notice: Subject to any disclaimer, the term of this patent is extended or adjusted under 35 U.S.C. 154(b) by 0 days.

(21) Appl. No.: 10/438,047

(22) Filed: May 15, 2003

(65) Prior Publication Data
US 2003/0214357 A1 Nov. 20, 2003

(30) Foreign Application Priority Data

May 16, 2002 (KR) .................................. 10-2002-0027098
Nov. 29, 2002 (KR) .................................. 10-2002-0075285

(51) Int. Cl.[7] .............................. H03G 3/30; H03F 1/36
(52) U.S. Cl. ........................ 330/282; 330/86; 330/278
(58) Field of Search ........................ 330/51, 85, 86, 330/278, 282, 291, 292, 293

(56) References Cited
U.S. PATENT DOCUMENTS 5,355,096 A * 10/1994 Kobayashi .................. 330/278
5,949,286 A    9/1999  Jones
6,285,257 B1   9/2001  Abe et al.
6,307,433 B1 * 10/2001 Ikeda .......................... 330/86
6,667,657 B1 * 12/2003 Nakatani et al. ............. 330/51

* cited by examiner

Primary Examiner—Khanh V. Nguyen
(74) Attorney, Agent, or Firm—Shinjyu Global IP Counselors, LLP

(57) ABSTRACT

A broadband variable gain amplifier with improved linearity and gain characteristic is provided. According to the present invention, the broadband variable gain amplifier comprises: an amplification unit for amplifying an input signal applied to an input terminal and outputting an amplified signal to an output terminal; and a gain control unit which is connected between the input and output terminals, and for controlling gain of said amplification unit, wherein said gain control unit comprises: a variable resistance unit whose resistance value is varied according to a control signal; and a broadband matching unit for proving an optimal impedance characteristic to the input terminal said amplification unit in a broad band, where in said variable gain resistance unit and said broadband matching unit is connected in parallel.

18 Claims, 15 Drawing Sheets

BROADBAND VARIABLE GAIN AMPLIFIER WITH HIGH LINEARITY AND VARIABLE GAIN CHARACTERISTIC

TECHNICAL FIELD

The present invention relates to a variable gain amplifier and, more particularly, a variable gain amplifier with high linearity and variable gain characteristic in a high frequency band.

BACKGROUND OF THE INVENTION

A variable gain amplifier is a device for maintaining a desired level of output signals by adjusting gain, in a radio frequency communication system.

FIG. 1a shows a circuit diagram of a conventional feedback type variable gain amplifier disclosed in U.S. Pat. No. 6,285,257.

The conventional feedback type variable gain amplifier disclosed in U.S. Pat. No. 6,285,257 is provided with an amplifier AMP1, and gain control circuit GC1 which is a feedback circuit coupled to the amplifier AMP1 and controls a value of the gain. The amplifier AMP1 includes a series-connected high frequency cutoff inductor L11 and amplifying field effect transistor FET11 across a power-supply potential terminal VDD and a ground potential terminal GND. The gate of the transistor FET11 is connected to a signal input terminal VIN, and the drain is connected to a signal output terminal VOUT. The gain control circuit GC1 includes a series-connected gain control field effect transistor FET12 and direct-current cutoff capacitor C11 across the signal output terminal VOUT and the signal input terminal VIN. Furthermore, a resistor R11 connected across the drain and the source of the gain control field effect transistor FET12.

In this conventional feedback type variable gain amplifier, the resistor R11 maintains levels at the drain and source of the transistor FET12 to the same potential, the capacitor C11 isolates levels at the gate of the transistor FET11 from the power-supply potential VDD. Furthermore, by varying a voltage Vgc applied to a gain control terminal Vc1, which is the gate of the transistor FET12, the transistor FET12 and the resistor R11 function as a variable resistor having a resistance value R(Vgc).

FIG. 1b shows a circuit diagram of an equivalent circuit of the gain control circuit GC1 in the conventional feedback type variable gain amplifier shown in FIG. 1a. The equivalent circuit of the gain control circuit GC1 is expressed by a series connection of a variable resistor R12 and a direct-current cutoff capacitor C11.

One can adjust the gain of the variable gain amplifier, shown in FIG. 1a and FIG. 1b, by varying the resistance value of the variable resistor R12 by the control voltage Vc1.

However, a noise figure of the variable gain amplifier is low owing to a parasitic capacitance of the transistor FET12. Moreover, there is a problem that an input impedance of the variable gain amplifier is varied according to the power levels of the input signal. Furthermore, low noise figure and diminution of the gain in a high frequency band make a range of frequency where the variable gain amplifier can be matched be narrow.

BRIEF SUMMARY OF THE INVENTION

In order to solve the above problem, an object of the present invention is to provide a variable gain amplifier with an improved variable gain characteristic in a high frequency band.

Another object of the present invention is to provide a variable gain amplifier where performance deterioration owing to a parasitic capacitance of a transistor for controlling gain is minimized.

Still another object of the present invention is to provide a variable gain amplifier whose input impedance can be matched in a broad band.

Still another object of the present invention is to provide a variable gain amplifier whose linearity and noise figure are improved.

According to an aspect of the present invention, a variable gain amplifier is provided, which comprises: an amplification unit for amplifying an input signal applied to an input terminal and outputting an amplified signal to an output terminal; and a gain control unit which is connected between the input and output terminals, and for controlling gain of the amplification unit, wherein the gain control unit comprises: a variable resistance unit whose resistance value is varied according to a control signal; and a broadband matching unit for proving an optimal impedance characteristic to the input terminal the amplification unit in a broad band, where in the variable gain resistance unit and the broadband matching unit is connected in parallel. The amplification unit comprises first transistor having first, second, and third terminals, wherein quantity and direction of current flowing from the second terminal to the third terminal is varying in dependant on voltage applied to the first terminal; and a load impedance which is connected between the second terminal and a voltage source, wherein the first terminal of the first transistor is connected to the input terminal, and the second terminal is connected to the output terminal, and the third terminal is grounded. The variable resistance unit comprises a transistor having first, second, and third terminals, wherein quantity and direction of current flowing from the second terminal to the third terminal is varying in dependant on the control voltage applied to the first terminal; first capacitor and first resistor which are connected in series between the input terminal and the third terminal of the transistor; and second capacitor and second resistor which are connected in series between the output terminal and the second terminal of the transistor. The broadband matching unit comprises: a resistor; an inductor; and a capacitor which are connected in series. Moreover, a resistance value of one of the first and second resistors of the variable resistance unit may be substantially zero, and a capacitance value of one of the first and second capacitors of the variable resistance unit may be substantially infinite.

According to another aspect of the present invention, the variable resistance unit comprises a transistor having first, second, and third terminals, wherein quantity and direction of current flowing from the second terminal to the third terminal is varying in dependent on the control voltage applied to the first terminal; first resistor which is connected between the second and third terminals of the transistor; first capacitor which is connected between the input terminal and the third terminal of the transistor; and second capacitor and second resistor which are connected between the output terminal and the second terminal of the transistor. According to an embodiment of the present invention, a resistance value of the second resistor of the variable resistance unit may be substantially zero, and a capacitance value of the second capacitor of the variable resistance unit may be substantially infinite.

According to further aspect of the present invention, a variable gain amplifier operating in a high gain mode and a low gain mode is provided, which comprises: an amplification unit for amplifying an input signal applied to an input terminal and outputting an amplified signal to an output terminal; a broadband matching unit connected between the input terminal and the output terminal for proving an optimal impedance characteristic to the input terminal in the high gain mode; an attenuation unit connected between the input terminal and the output terminal for attenuating the input signal and outputting an attenuated signal to the output terminal in the low gain mode; and means connected to the input terminal for activating the amplification unit in the high gain mode. The amplification unit comprises a transistor having first, second, and third terminals, wherein quantity and direction of current flowing from the second terminal to the third terminal is varying in dependant on voltage applied to the first terminal; and a load impedance which is connected between the second terminal of the transistor and a voltage source, wherein the first terminal of the transistor is connected to the input terminal, and the second terminal is connected to the output terminal, and the third terminal is grounded. The broadband matching unit comprises: a capacitor; an inductor; a resistor; and switch which are connected in series. The attenuation unit comprises a capacitor, a resistor, and a switch, which are connected in series. The means for activating the transistor in the high gain mode comprises a switch and a bias voltage source. The transistor is a MOSFET transistor, and the first terminal is a gate, the second terminal is a drain, and the third terminal is a source.

According to still further aspect of the present invention, the variable gain amplifier may further comprise second amplification circuit for amplifying a differential input signal applied between first and second input terminals and outputting an amplified signal between first and second output terminals comprising: first and second transistors having first, second, and third terminals, wherein quantity and direction of current flowing from the second terminal to the third terminal is varying in dependant on voltage applied to the first terminal, wherein the first terminals are connected to the first and second input terminals, respectively, and the second terminals are connected to the first and second output terminals, respectively; first and second load impedances connected between the second terminals of the first and second transistors and a voltage source, respectively; first and second current sources for providing currents to the third terminals of the first and second terminals, respectively; a source degeneration variable resistor connected between the third terminals of the first and second transistors; and a load degeneration variable resistor connected between the second terminals of the first and second transistors, wherein one terminal of the first and second input terminals is connected to the output terminal, and another terminal is grounded.

According to still further aspect of the present invention, the variable gain amplifier may further comprise third amplification circuit for amplifying a differential input signal applied between first and second input terminals and outputting an amplified signal between first and second output terminals comprising: first and second transistors having first, second, and third terminals, wherein quantity and direction of current flowing from the second terminal to the third terminal is varying in dependant on voltage applied to the first terminal, wherein the first terminals are connected to the first and second input terminals, respectively, and the second terminals are connected to the first and second output terminals, respectively; first and second load impedances which are connected between the second terminals of the first and second transistors and a voltage source, respectively; first and second current sources for providing current to the third terminal of the first and second terminals, respectively; and a source degeneration variable resistor which are connected between the third terminals of the first and second transistors, wherein one terminal of the first and second input terminals is connected to the output terminal, and another terminal is grounded.

BRIEF DESCRIPTION OF THE DRAWINGS

FIG. 1b shows a circuit diagram of an equivalent circuit of the gain control circuit GC1 in the conventional feedback type variable gain amplifier shown in FIG. 1a.

DETAILED DESCRIPTION

Hereinafter, preferred embodiments of the present invention will be described in detail with reference to the attached drawings.

The variable gain amplifier according to the present invention utilizes one or more active elements. Each active elements has a gate gn, source sn and drain dn. The active element has a characteristic that the direction and the quantity of current flowing from the drain dn to the source sn or vice versa are determined according to the polarity and the amount of the voltage applied to the gate gn and the source sn. Active elements having such characteristic includes bipolar junction transistor (BJT), junction field effect transistor (JFET), metal oxide semiconductor field effect transistor (MOSFET), and metal semiconductor field effect transistor (MESFET).

Some active elements have body terminal bn besides the gate gn, source sn, and drain dn. Such active elements have a characteristic that the direction and the quantity of current flowing from the drain dn to the source sn or vice versa are determined according to the polarity and the amount of the voltage applied to the gate gn and the body dn. Active elements having such characteristic includes metal oxide semiconductor field effect transistor (MOSFET).

It will be described using MOSFET as an example. However, the spirit of the present invention can be applied to all active elements which can be used as an amplifier as well as the MOSFET. Therefore, the idea and the scope of the present invention is not confined to the MOSFET though the description is concentrated to the MOSFET in this specification.

In attached drawings, all of the active elements are N-type MOSFETs, and the description will be concentrated to the N-type MOSFET. However, it is apparent to those skilled in the art that the complementary circuit to the circuit of the drawings may be composed using the complementary elements of N-type MOSFET.

1. A feedback variable gain amplifier with high linearity according to an embodiment of the present invention.

Figure 1A:
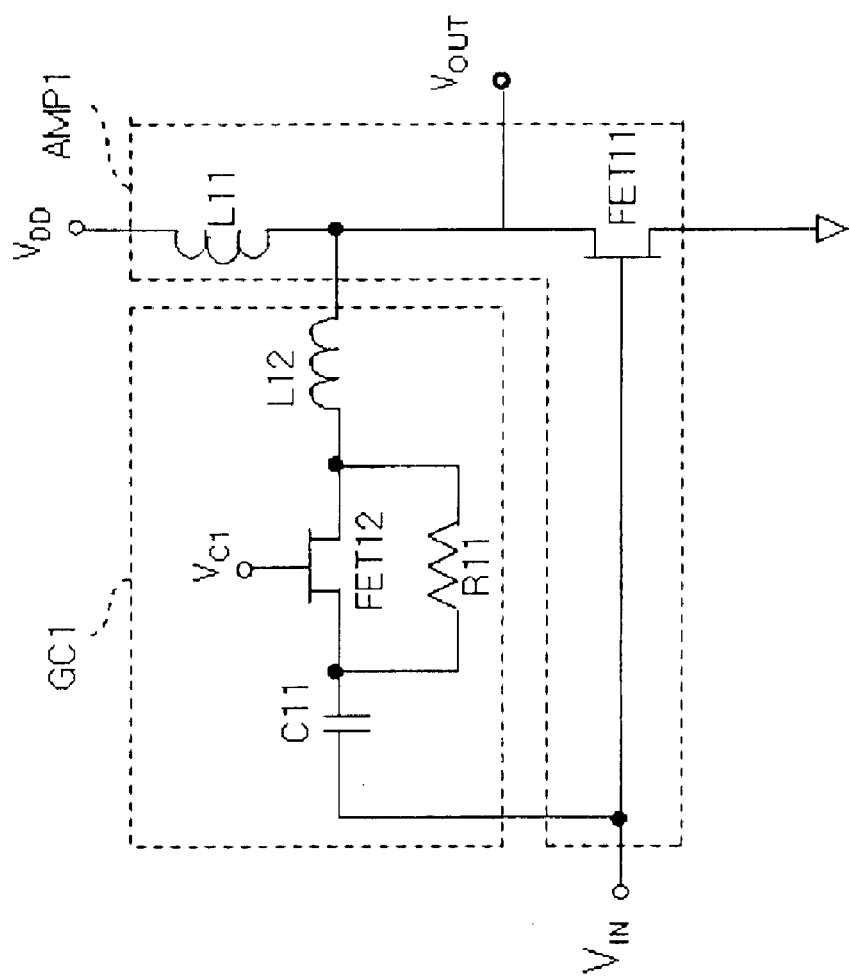
FIG. 1a shows a circuit diagram of a conventional feedback type variable gain amplifier.
Figure 1B:
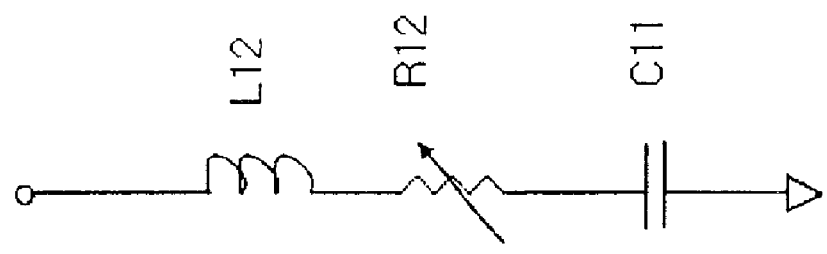
Figure 2:
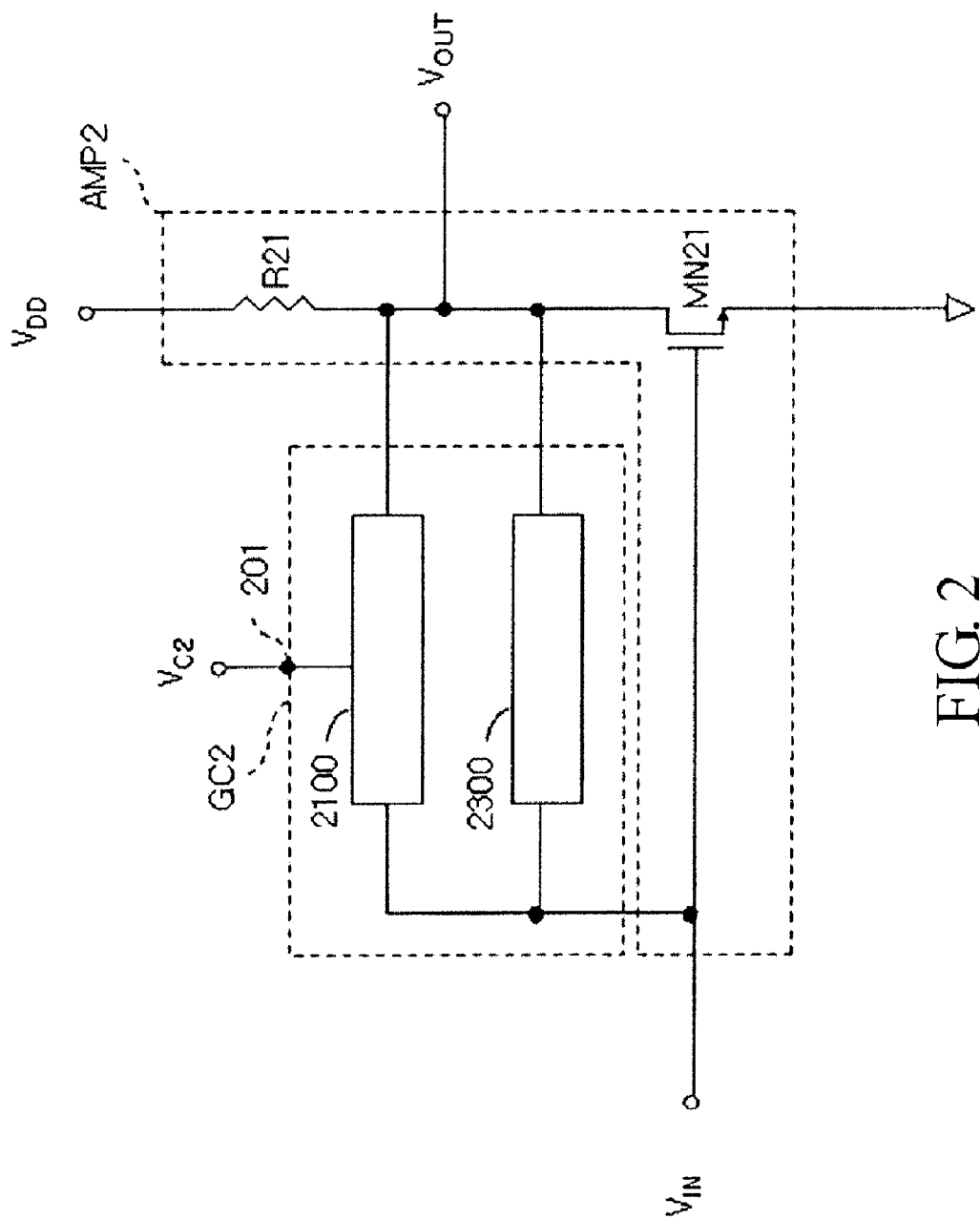
FIG. 2 shows a circuit diagram of a variable gain amplifier according to an embodiment of the present invention.

FIG. 2 shows a circuit diagram of a variable gain amplifier according to an embodiment of the present invention.

As shown in FIG. 2, the variable gain amplifier comprises an amplification unit AMP2 and a gain control unit GC2. The gain control unit GC2 is connected between an input and output terminals VIN, VOUT of the amplification unit AMP2, and comprises a variable resistance unit 2100 and a broadband matching unit 2300 which are connected in parallel.

The amplification unit AMP2 has a load impedance R21 which is connected between a voltage source VDD and the output terminal VOUT, and the first transistor MN21. A gate of the first transistor MN21 is connected to the input terminal VIN, and a drain of the first transistor MN21 is connected to the output terminal VOUT. The amplification unit AMP2 is embodied to various circuits, and operation of the amplification unit AMP2 is apparent to skilled person in the field to which the present invention pertains.

A resistance value of the variable resistance unit 2100 is varied by a control voltage Vc2 which is applied to a control terminal 201. The broadband matching unit 2300 forms a feedback between the input and output terminals VIN, VOUT. Moreover, the broadband matching unit 2300 provides an optimal impedance characteristic to the input terminal VIN of the amplification unit AMP2 so that the variable gain amplifier according to the present invention has a flat gain, and can be matched in a broad band.

Figure 3:
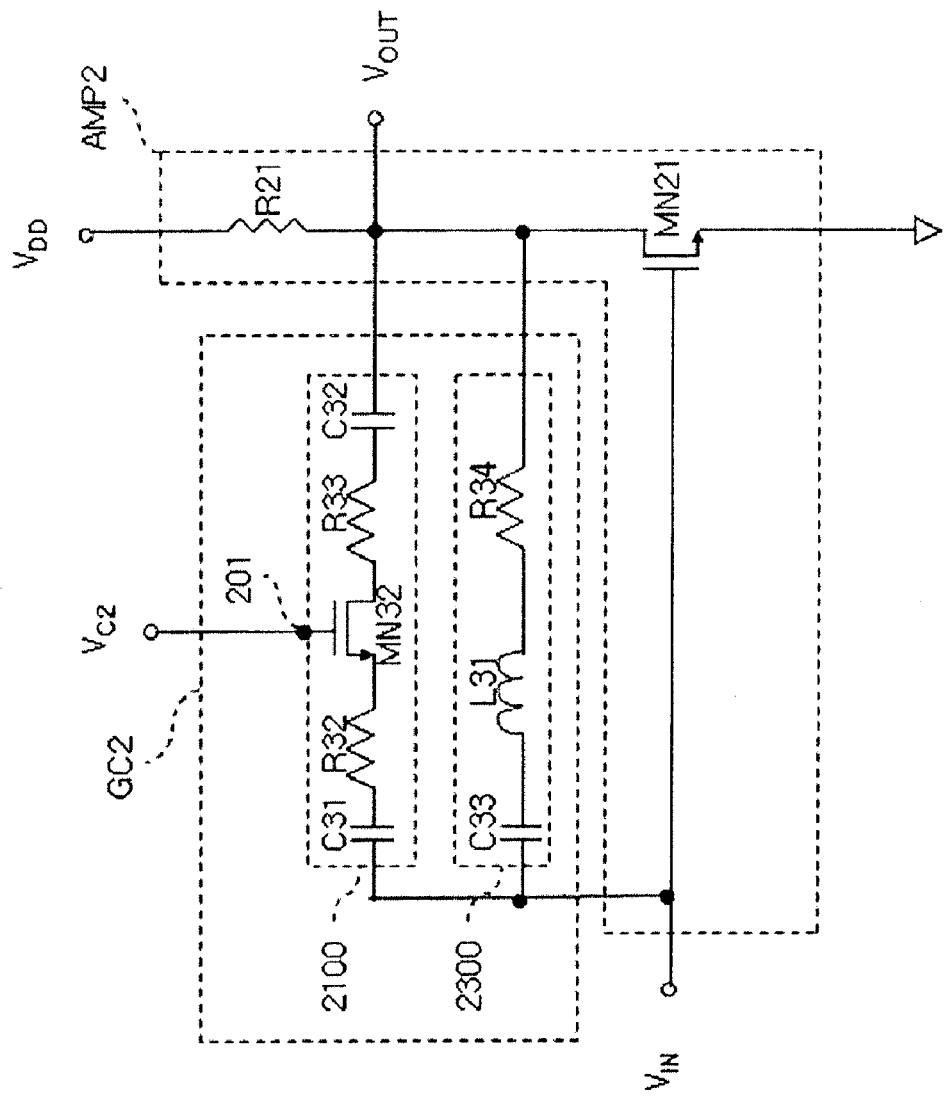
FIG. 3 shows a circuit diagram of the variable gain amplifier shown in FIG. 2 more specifically according to an embodiment of the present invention.

FIG. 3 shows a circuit diagram of the variable gain amplifier shown in FIG. 2 more specifically according to an embodiment of the present invention.

As shown in FIG. 3, the variable resistance unit 2100 comprises the second transistor MN32, the first capacitor C31 and the first resistor R32 which are connected in series between the input terminal VIN and a source of the second transistor MN32, and the second capacitor C32 and the second resistor R33 which are connected in series between the output terminal VOUT and a drain of the second transistor MN32. A gate of the second transistor MN32 is formed by the control terminal 201 of the variable resistance unit 2100.

A bias means may be provided to the second transistor MN32. Various methods well known to a skilled person in the field to which the present invention pertains may be used to bias the second transistor MN32. As an example, a terminal for biasing the second transistor MN32 may be connected between a drain and source of the second transistor MN32, or connected to one of the drain and the source.

The broadband matching unit 2300 comprises a resistor R34, an inductor L31, and a capacitor C33 which are connected in series.

Below, operation of the variable gain amplifier according to the present invention is illustrated, with reference to FIG. 3.

The first and second capacitors C31, C32 isolate levels at the gate of the first transistor MN21 of the amplification unit AMP2 from the source voltage VDD by blocking DC currents. Moreover, the second capacitor C32 isolates levels at the drain of the second transistor MN32 form the voltage source VDD. Accordingly, a range of useable transistors as the second transistor MN32 is extended. The second transistor MN32 controls the gain of the variable gain amplifier by functioning as a variable resistor whose resistance value is varied according to the control voltage Vc2 applied to the gate of the second transistor MN32. The first and second resistors R32, R33 decrease an effect of a parasitic capacitance generated in the second transistor MN32. Accordingly, the variable gain characteristic of the variable gain amplifier is improved in a high frequency band.

The variable gain amplifier according to the present invention can be matched in a broad band, and have a flat gain in a high frequency band by setting impedance values of the resistor R34, the inductor L31, and the capacitor C33 of the broadband matching unit 2300 to predetermined values. In other words, when an amplifier is used, an impedance transform process for impedance matching for signals applied the input terminal VIN is required, because a transistor for amplifying input signals, generally, has high input impedance. An inductor, a capacitor, and a resistor, etc. are generally used for reducing the impedance of the transistor. However, impedances of the inductor and capacitor are varied according to frequencies, so that it is difficult in matching impedance of the transistor in a broad band. In the present invention, such a problem is solved by connecting the variable resistance unit 200 to feedback.

By pre-described construction, the variable gain amplifier according to the present invention can vary the gain by maintaining a characteristic of a main amplifier AMP2 in a high frequency band. Moreover, the variable gain amplifier can be matched in a broad band.

Figure 4:
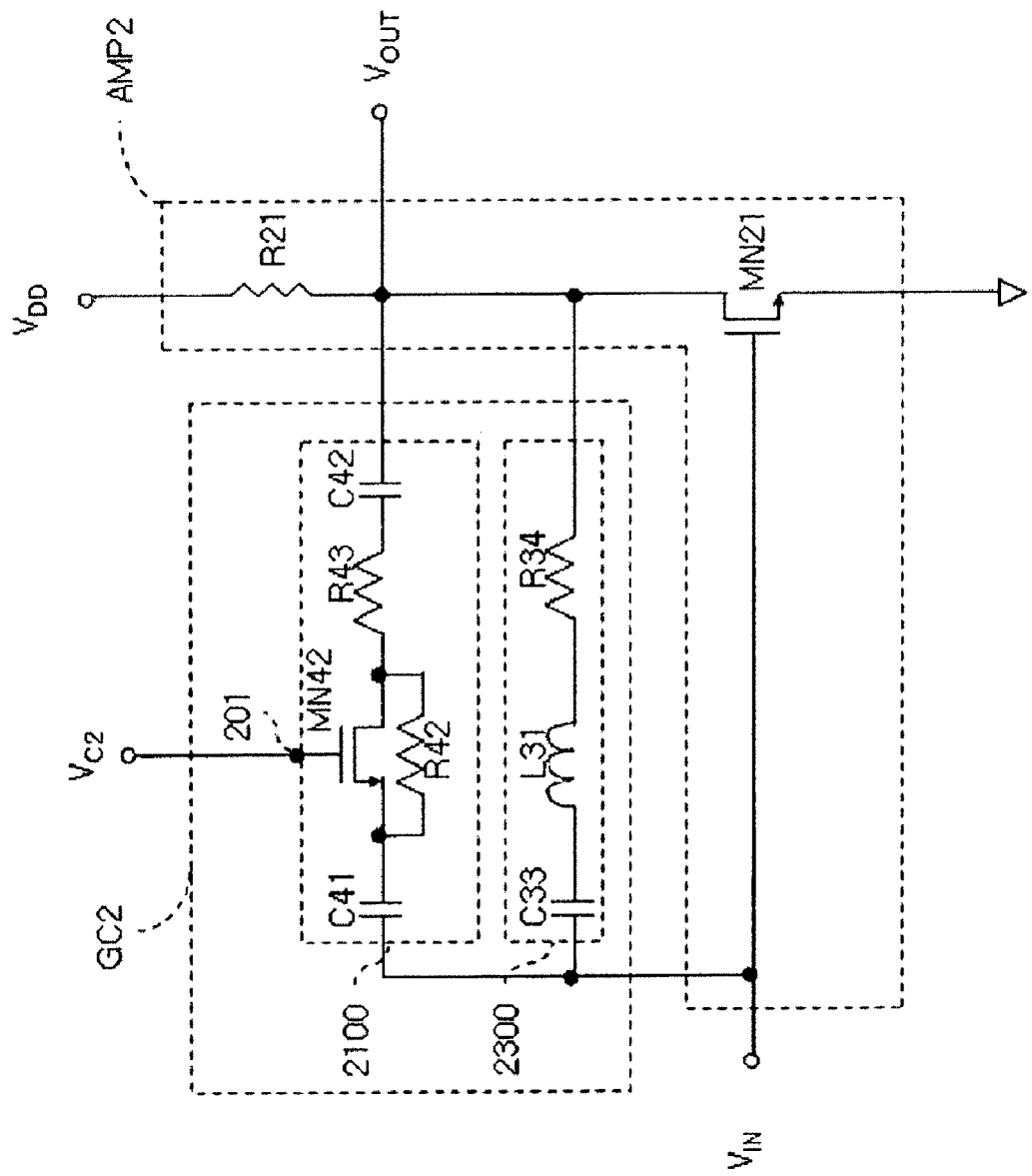
FIG. 4 shows a circuit diagram of the variable gain amplifier shown in FIG. 2 more specifically according to another embodiment of the present invention.

FIG. 4 shows a circuit diagram of the variable gain amplifier shown in FIG. 2 more specifically according to another embodiment of the present invention.

As shown in FIG. 4, the variable gain amplifier according to another embodiment has a difference in the variable resistance unit 2100 from the circuit shown in FIG. 3. More specifically, the second transistor MN42 and the first resistor R42 are connected in parallel. Accordingly, the variable resistance unit 2100 has the second transistor MN42 and the first resister R42 which are connected in parallel, the first capacitor C41 which is connected between the input terminal VIN and a source of the second transistor MN42, the second resister R43 and the second capacitor C42 which are connected between the output terminal VOUT and a drain of the second transistor MN42.

Figure 5:
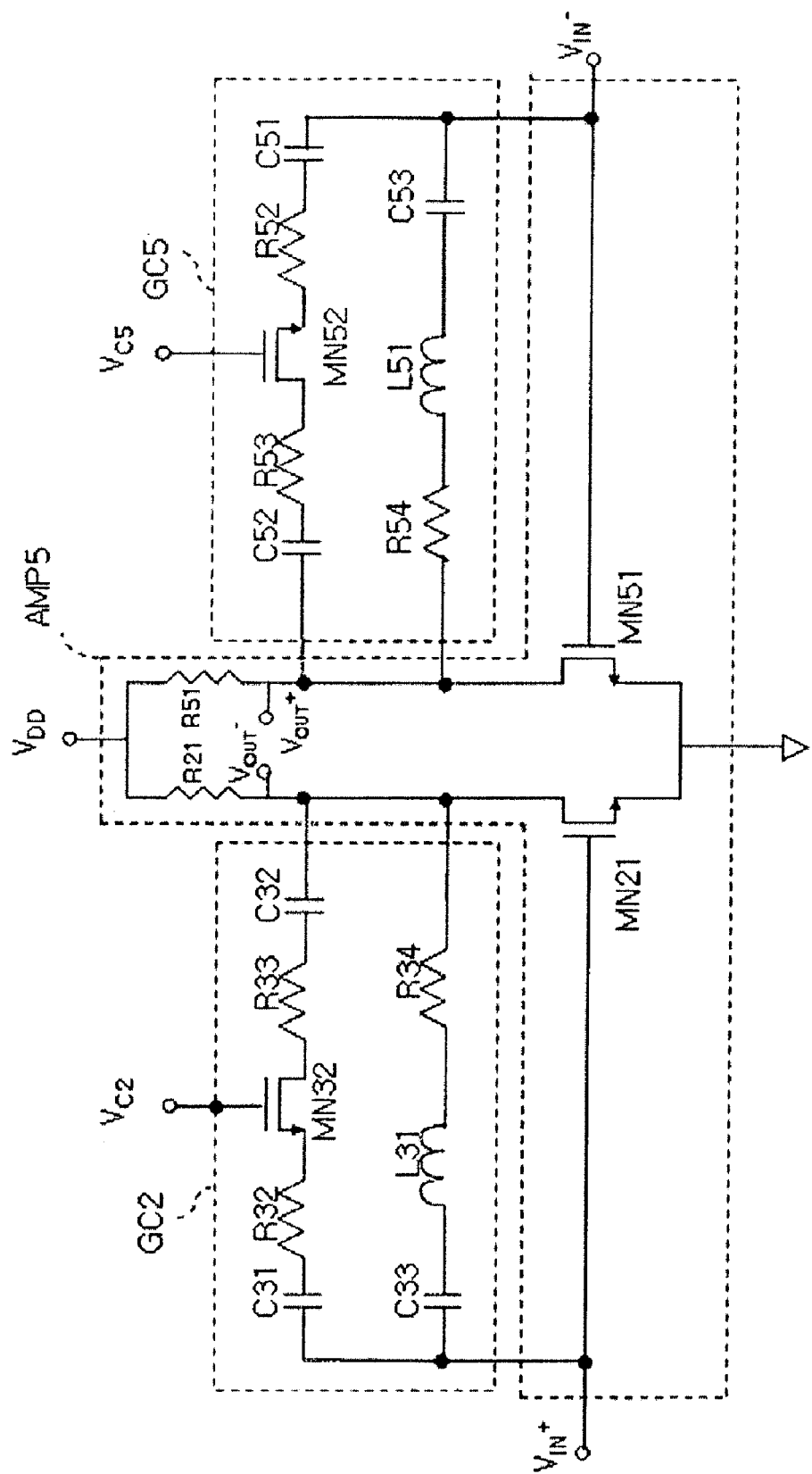
FIG. 5 shows a circuit diagram of the variable gain amplifier shown in FIG. 2 according to another embodiment of the present invention.

FIG. 5 shows a circuit diagram of the variable gain amplifier shown in FIG. 2 according to another embodiment of the present invention.

As shown in FIG. 5, the variable gain amplifier according to another embodiment has a difference that it is embodied to a differential amplifier from the variable gain amplifier shown in FIG. 3. In other words, the variable gain amplifier comprises a differential amplification unit AMP5, and the first and second gain control units GC2, GC5.

The differential amplification unit AMP5 comprises two single-ended type amplifier such as the amplification unit AMP2 shown FIG. 3. The differential amplification unit AMP5 has the first and second input terminals VIN−, VIN+, and the first and second output terminals VOUT+, VOUT−. Moreover, the differential amplification unit AMP5 amplifies a differential signal applied between the first and second input terminals VIN+, VIN−, and outputs an amplified signal between the first and second output terminals VOUT−, VOUT+.

The first and second gain control units GC2, GC5 are embodied to substantially same construction, and connected between the first and second input terminals VIN+, VIN− and the first and second output terminals VOUT−, VOUT+ of the differential amplification unit AMP5, respectively. The first and second gain control units GC2, GC5 control the gain of the variable gain amplifier in a broad band.

Figure 6:
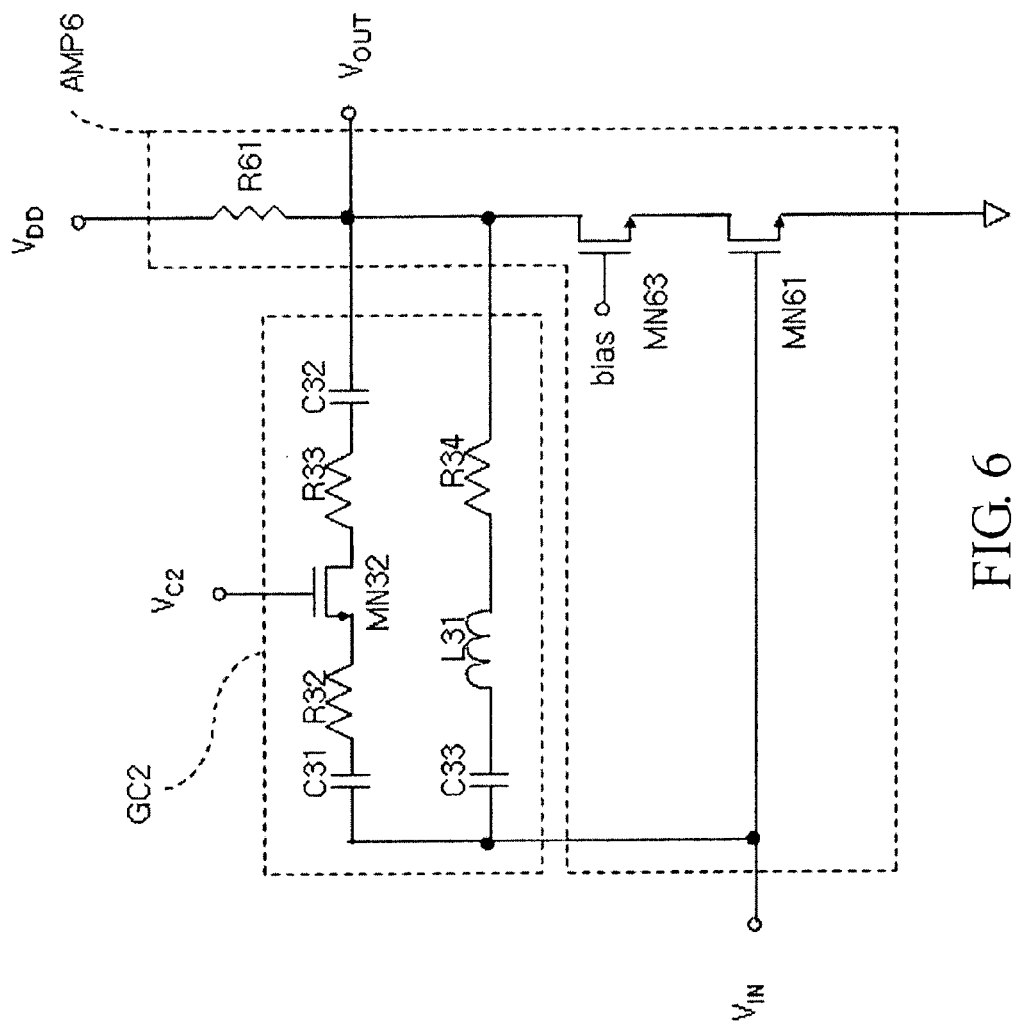
FIG. 6 shows a circuit diagram of the variable gain amplifier shown in FIG. 2 according to another embodiment of the present invention.

FIG. 6 shows a circuit diagram of the variable gain amplifier shown in FIG. 2 according to another embodiment of the present invention.

As shown in FIG. 6, the variable gain amplifier according to another embodiment has a difference in the amplification unit AMP6 from the circuit shown in FIG. 3. Specifically, a third transistor MN63 is connected between the first transistor MN61 and the output terminal VOUT. Accordingly, the amplification unit AMP6 comprises a load impedance R61, and the first and second transistors MN61, MN63. Moreover, a bias voltage may be applied to a gate of the third transistor MN63. The third transistor MN63 raises the gain by enlarging an output resistance of the variable gain amplifier.

Figure 7:
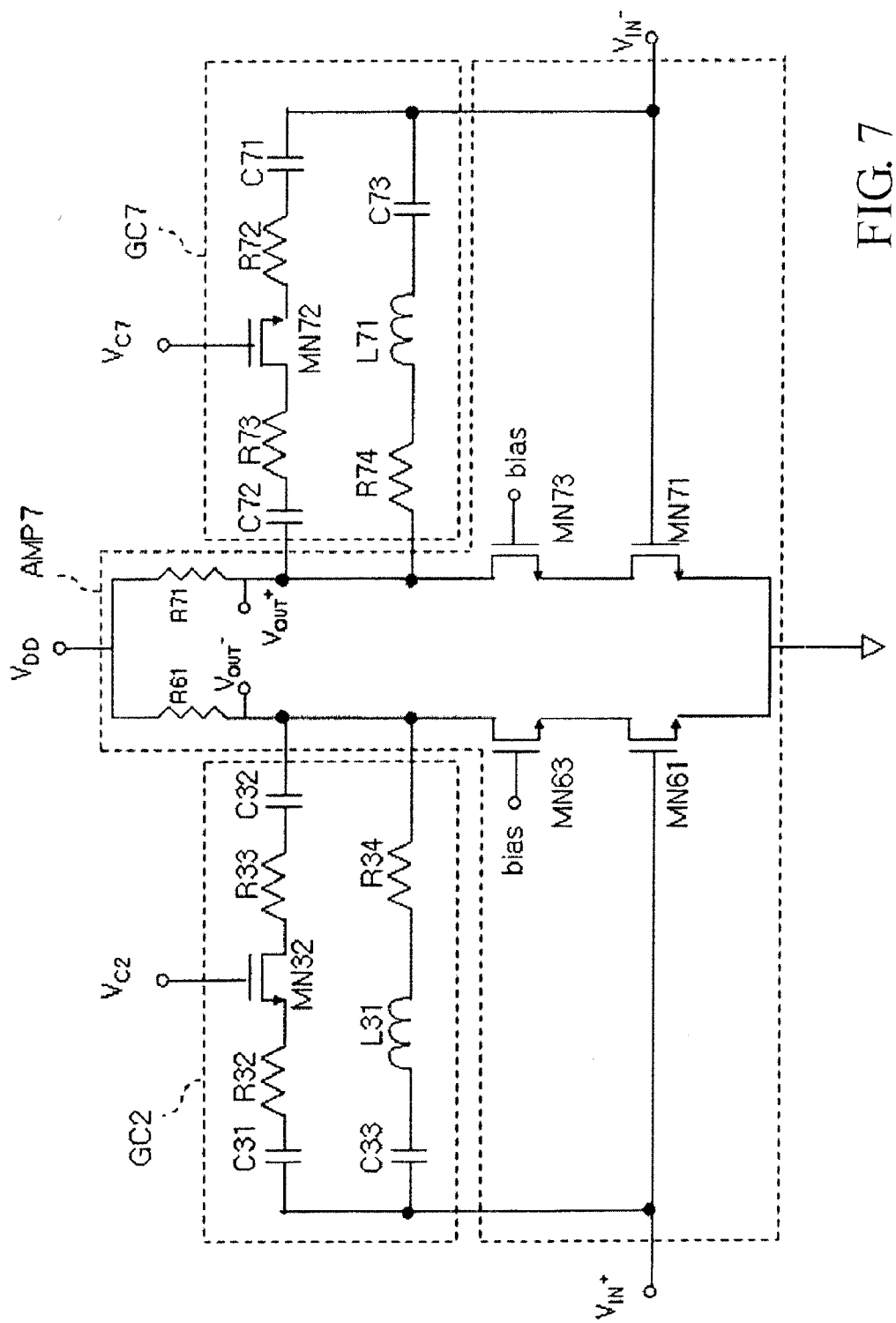
FIG. 7 shows a circuit diagram of the variable gain amplifier shown in FIG. 2 according to another embodiment of the present invention.

FIG. 7 shows a circuit diagram of the variable gain amplifier shown in FIG. 2 according to another embodiment of the present invention.

As shown in FIG. 7, the variable gain amplifier according to another embodiment has a difference that it is embodied to a differential amplifier from the circuit shown in FIG. 6.

Specifically, the variable gain amplifier comprises a differential amplification unit AMP7, and the first and second gain control units GC2, GC7. The differential amplification unit AMP7 comprises two single-ended type amplifier such as the amplification unit AMP6 shown in FIG. 6. The differential amplification unit AMP7 has the first and second input terminals VIN−, VIN+, and the first and second output terminals VOUT−, VOUT+. Moreover, the differential amplification unit AMP7 amplifies a differential signal applied between the first and second input terminals VIN+, VIN−, and outputs an amplified signal between the first and second output terminals VOUT−, VOUT+.

The first and second gain control units GC2, GC7 are embodied to substantially same construction, and connected between the first and second input terminals VIN+, VIN− and the first and second output terminals VOUT−, VOUT+ of the differential amplification unit AMP7, respectively. The first and second gain control units GC2, GC7 control the gain of the variable gain amplifier in a broad band.

Figure 8:
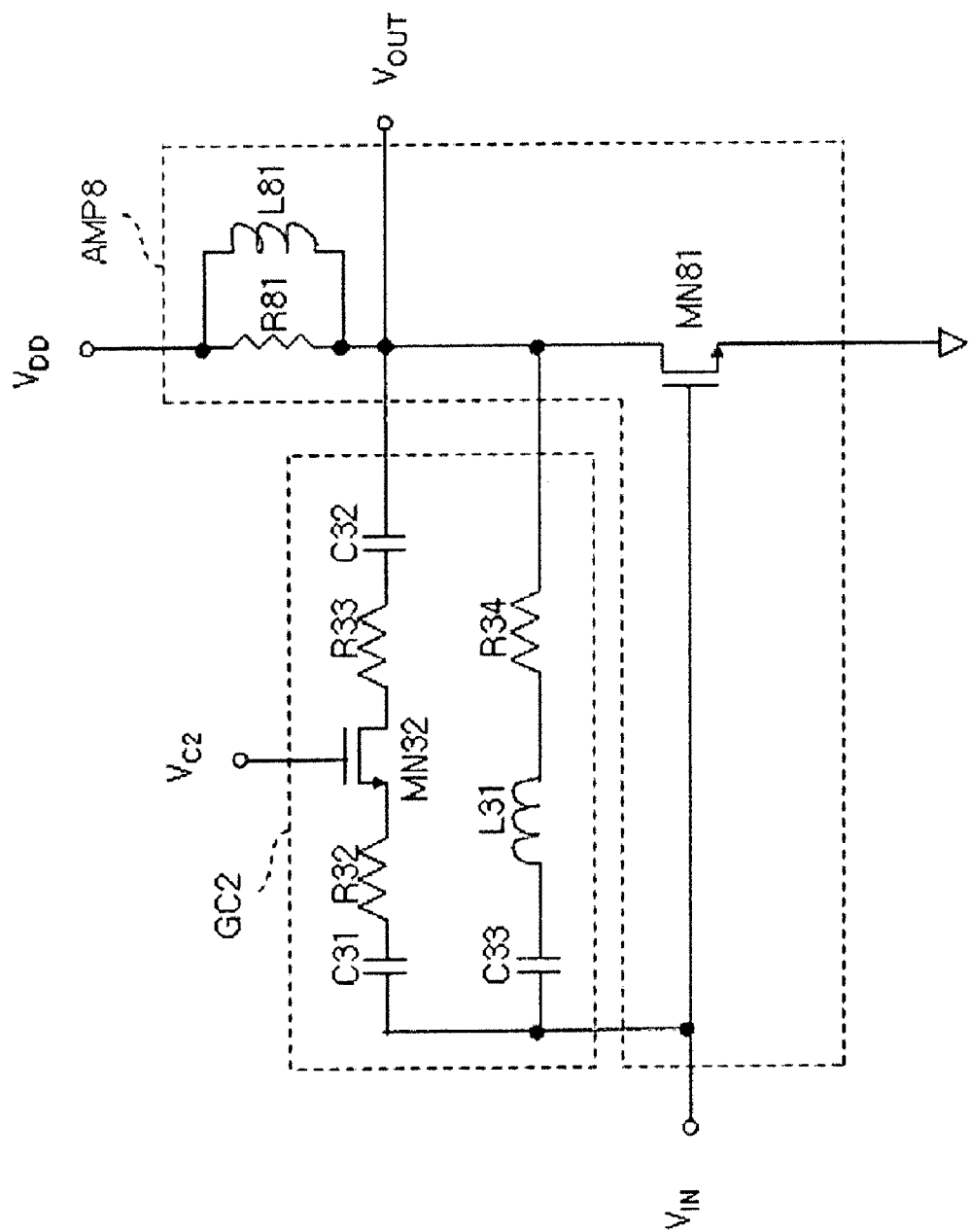
FIG. 8 shows a circuit diagram of the variable gain amplifier shown in FIG. 2 according to another embodiment of the present invention.

FIG. 8 shows a circuit diagram of the variable gain amplifier shown in FIG. 2 according to another embodiment of the present invention.

As shown in FIG. 8, the variable gain amplifier according to another embodiment has a difference in the amplification unit AMP8 from the circuit shown in FIG. 3. Specifically, an inductor L81 is connected to the resistor R81 in parallel. In this case, linearity of the variable gain amplifier is improved as the voltage Vds between a drain and source of the first transistor MN81 is larger than that of pre-described amplifier where only load resistor R81 is provided.

Although two or more resistors are provided to the variable resistance unit 2100 in pre-described embodiments, a resistance value of one resistor may be substantially zero. In this case, a range of adjustable resistance value is to be small, but there is an advantage that the number of elements is reduced.

Moreover, although two or more capacitors are provided to the variable resistance unit 2100, a capacitance value of one capacitor may be substantially infinite. In this case, a range of usable transistor may be small, but almost effect of the present invention can be acquired with small number of elements.

2. A broadband variable gain amplifier with high linearity which operates in switch mode according to another embodiment of the present invention.

Figure 9:
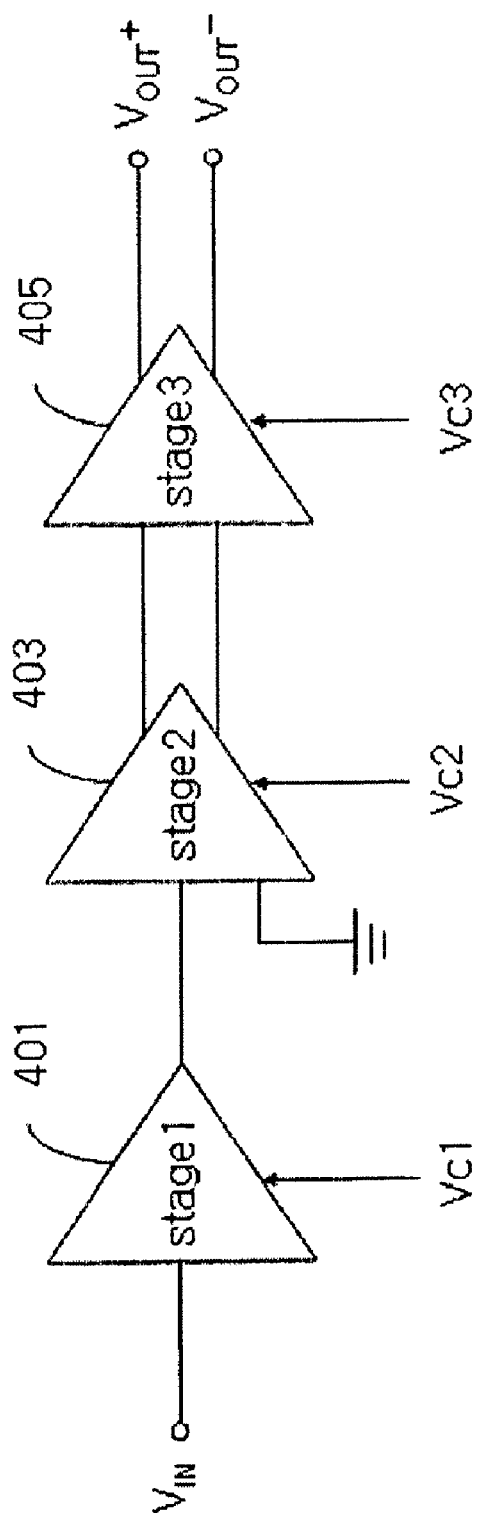
FIG. 9 shows a block diagram of a broadband variable gain amplifier with high gain linearity according to another embodiment of the present invention.

FIG. 9 shows a block diagram of a broadband variable gain amplifier with high linearity according to another embodiment of the present invention.

As shown in FIG. 9, the variable gain amplifier comprises the first to third amplification units 401~403. The first to third control signals Vc1~Vc3 are applied to the first to third amplification units 401~403, respectively. Moreover, gains of the first to third amplification units 401~403 are controlled by the first to third control signals Vc1~Vc3, respectively.

The first amplification unit 401 amplifies a signal applied to an input terminal VIN, and outputs an amplified signal to the second amplification unit 403. In the variable gain amplifier according to the present invention, the first amplification unit 401 is embodied to operate in a high gain mode and a low gain mode according to the first control signal Vc1.

The second amplification unit 403 is embodied to a differential circuit, and amplifies the signal outputted from the first amplification unit 401, and outputs an amplified signal. Gain of the second amplification unit 403 is varied according to the second control voltage Vc2.

The third amplification unit 405 is also embodied to a differential circuit, and amplifies the signal outputted from the second amplification unit 403, and outputs an amplified signal. The gain of the third amplification unit 405 is varied according to the third control voltage Vc3.

Figure 10:
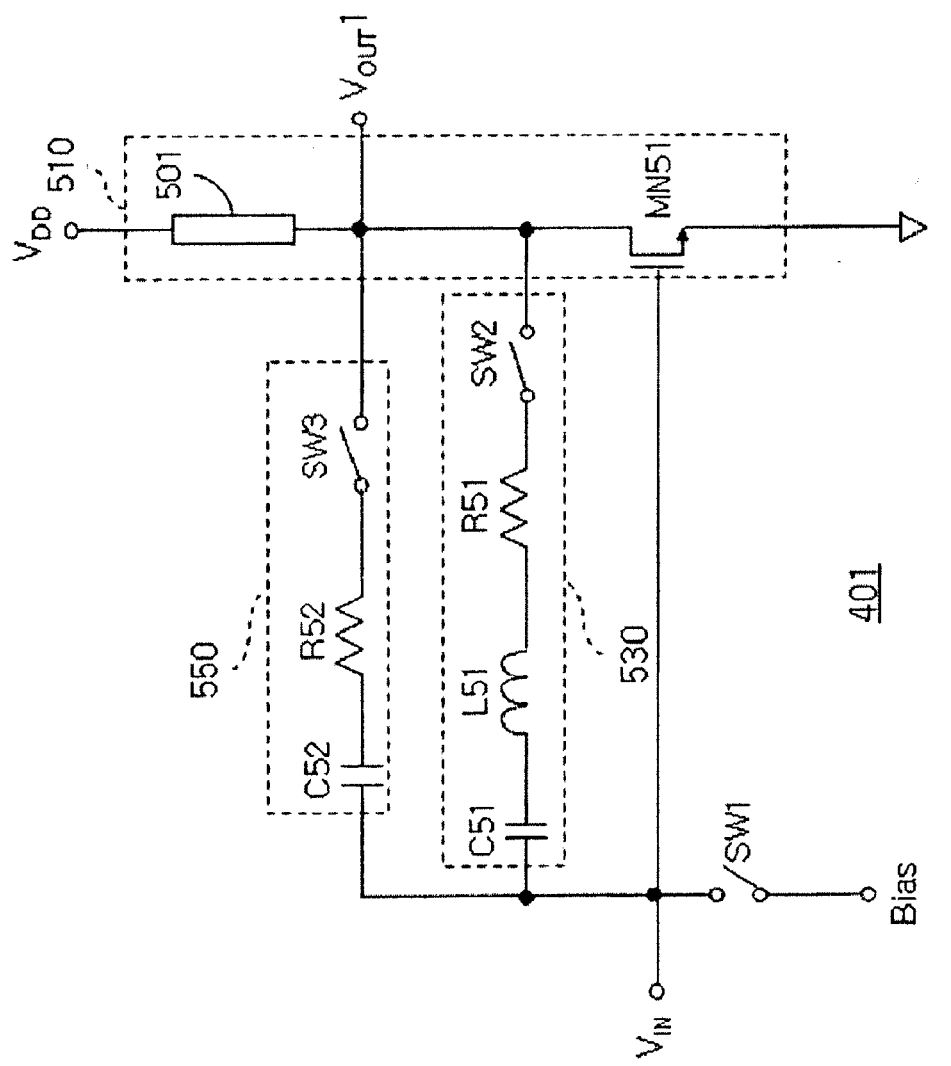
FIG. 10 shows a circuit diagram of the first amplification unit 401 of the variable gain amplifier shown in FIG. 9.

FIG. 10 shows a circuit diagram of the first amplification unit 401 of the variable gain amplifier shown in FIG. 9.

As shown in FIG. 10, the first amplification unit 401 comprises an amplification unit 510, the first switch SW1, a broadband matching unit 530, and an attenuation unit 550.

The amplification unit 510 of the first amplification unit 401 amplifies an input signal applied to an input terminal VIN and outputting an amplified signal to an output terminal VOUT1 by comprising a transistor MN51, and a load impedance 501. A gate of the transistor MN51 forms the input terminal VIN of the first amplification unit 401, and a drain of the transistor MN51 is connected to one terminal of the load impedance 501, and forms the output terminal VOUT1 of the first amplification unit 401. Moreover, a source of the transistor MN51 is grounded.

One terminal of the first switch SW1 is connected to the gate of the transistor MN51, and another terminal is connected to a voltage source Bias.

The broadband matching unit 530 is connected between the input and output terminals VIN, VOUT1 of the amplification unit 510, and provides an optimal impedance characteristic to the input terminal VIN by comprising the first capacitor C51, the first inductor L51, the first resistor R51, and the second switch SW2 which are connected in series. Moreover, according to an embodiment of the present invention, as shown in FIG. 10, one terminal of the first capacitor C51 is connected to the input terminal VIN of the amplification unit 510, and one terminal of the second switch SW2 is connected to the output terminal VOUT1 of the amplification unit 510.

The attenuation unit 550 is connected between the input and output terminals VIN, VOUT1 of the amplification unit 510, and comprises the second capacitor C52, the second resistor R52, and the third switch SW3 which are connected in series. According to an embodiment, as shown in FIG. 10, one terminal of the second capacitor C52 is connected to the input terminal VIN of the amplification unit 510, and one terminal of the third switch SW3 is connected to the output terminal VOUT1 of the amplification unit 510.

Below, operation of the first amplification unit 401 according to an embodiment of the present invention is illustrated referring to FIG. 10.

The first amplification unit 401 according to an embodiment operates in a high gain mode and a low gain mode. More specifically, when the power level of a signal applied to the input terminal VIN is below a predetermined value, the first amplification unit 401 operates in the high gain mode. On the other hand, when the power level of the signal applied to the input terminal VIN is above the predetermined value, the first amplification unit 401 operates in the low gain mode.

In the high gain mode, the first and second switches SW1, SW2 are closed, and the third switch is open. Accordingly, the bias voltage Bias is applied to the gate of the transistor MN51, and the transistor MN51 is activated. Moreover, the broadband matching unit 530 is activated, and the attenuation unit 550 is inactivated.

The transistor MN51 makes currents flow through the drain according to the voltage applied to the gate so that it amplifies the signal applied to the input terminal VIN.

The first capacitor of the broadband matching unit 530 blocks an inflow DC power to the broadband matching unit 530. Moreover, the variable gain amplifier according to the present invention can be matched in a broad band, and acquire a flat gain in a high frequency band, by setting impedance values of the first capacitor C51, the first inductor L51, and the first resistor R51 to appropriate values. In other words, an optimal impedance characteristic is provided to the input terminal Vin by connecting the broadband matching unit 530 to feedback, so that the variable gain amplifier can be matched in a broad band.

In the low gain mode, the first and second switches SW1, SW2 are open, and the third switch SW3 is closed. Accordingly, the transistor MN51 and the broadband matching unit 530 are inactivated, and only the attenuation unit 550 is activated.

More specifically, DC component of the signal applied to the input terminal VIN is blocked by the second capacitor C52, and only analog component of the signal is outputted to the output terminal VOUT1 through the second resistor R52, and the third switch SW3. In other words, the signal applied to the input terminal VIN is not passed to the transistor MN51, and attenuated by the second resistor R51 which is a passive element, and outputted to the output terminal VOUT1. Accordingly, linearity of the signal is very improved.

Moreover, resistance components of all the second resistor R51 and the third switch SW3 are dominate in impedance components, so that impedance variations of the second resistor R52 and the third switch SW3 are minute. Accordingly, the variable gain amplifier can be matched in a broad band by adjusting the impedance value of the second resistor R52 and the third switch SW3.

As described above, in case that a power level of the signal is low, the first amplification unit 401 according to the present invention amplifies the signal applied to the input terminal VIN with high gain so that a noise figure which is generated by rear blocks and affects whole system is decreased. On the other hand, in case that a power level of the signal is high, the first amplification unit 401 amplifies the signal with low gain so that linearity of the variable gain amplifier is improved by decreasing non-linearity which is generated by rear blocks and affects whole system.

Figure 11:
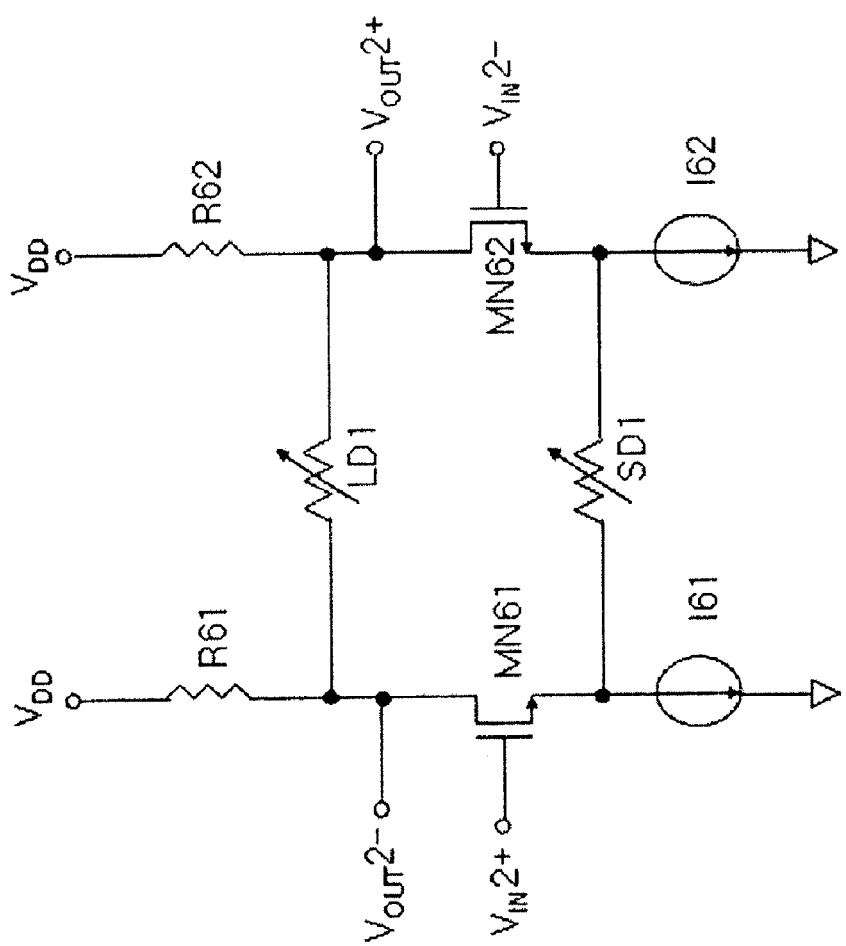
FIG. 11 shows a circuit diagram of the second amplification unit 403 of the variable gain amplifier shown in FIG. 9.

FIG. 11 shows a circuit diagram of the second amplification unit 403 of the variable gain amplifier shown in FIG. 9.

As shown in FIG. 11, the second amplification unit 403 comprises the first and second transistors MN61, MN62, the first and second load impedances R61, R62, and the first and second current source 161, 162, a source degeneration variable resistor SD1, and a load degeneration variable resistor LD1.

Gates of the first and second transistors MN61, MN62 form a first and second input terminals VIN2+, VIN2− of the second amplification unit 403, respectively, and drains are connected to one terminals of the first and second load impedances R61, R62, respectively, and form a first and second output terminals VOUT2−, VOUT2+ of the second amplification unit 403, respectively. The first and second bias current sources 161, 162 provides currents to sources of the first and second transistors MN61, MN62, respectively.

According to an embodiment of the present invention, one terminal of the first and second input terminals VIN2+, VIN2− is connected to the output terminal VOUT1 of the first amplification unit 401, and another terminal is grounded.

The load degeneration variable resistor LD1 is connected between the drains of the first and the second transistors MN61, MN62. Moreover, the source degeneration variable resistor SD1 is connected between the sources of the first and the second transistors MN61, MN62. Another terminals of the first and second load impedances R61, R62 are connected to a voltage source VDD.

Below, the operation of the second amplification unit 403 is illustrated.

Each of the first and second transistors MN61, MN62 controls current flowing through the drain to the source according to voltage applied to the gate. Moreover, voltages dropped by the first and second load impedances R61, R62 are varied according to current flowing through the drain. Accordingly, a differential voltage applied between the first and second input terminals VIN+, VIN− is amplified, and outputted between the first and second output terminals VOUT2−, VOUT2+.

The source degeneration variable resistor SD1 and the load degeneration variable resistor LD1 control the gain and linearity of the second amplification unit 403 by varying its resistance values according to the second control voltage Vc2. More specifically, if the resistance value of the source degeneration variable resistor SD1 is increased, the gain of the second amplification 403 unit 403 is decreased. On the other hand, the linearity is improved.

Moreover, a load resistance value of the second amplification unit 403 is varied by controlling the load degeneration variable resistor LD1, because the load degeneration variable resistor LD1 is connected to the first and second load impedances R61, R62 in parallel. More specifically, if the resistance value of the load degeneration variable resistor LD1 is decreased, total load resistance value of the amplification unit 403 is decreased, and the gain is decreased. On the other hand, if the resistance value of the load degeneration variable resistor LD1 is increased, an effect of the load degeneration resistor LD1 to the gain is reduced.

Accordingly, the gain and linearity of the second amplification unit 403 are controlled by the second control voltage Vc2 applied to the source degeneration variable resistor SD1 and the load degeneration variable resistor LD1.

Figure 12:
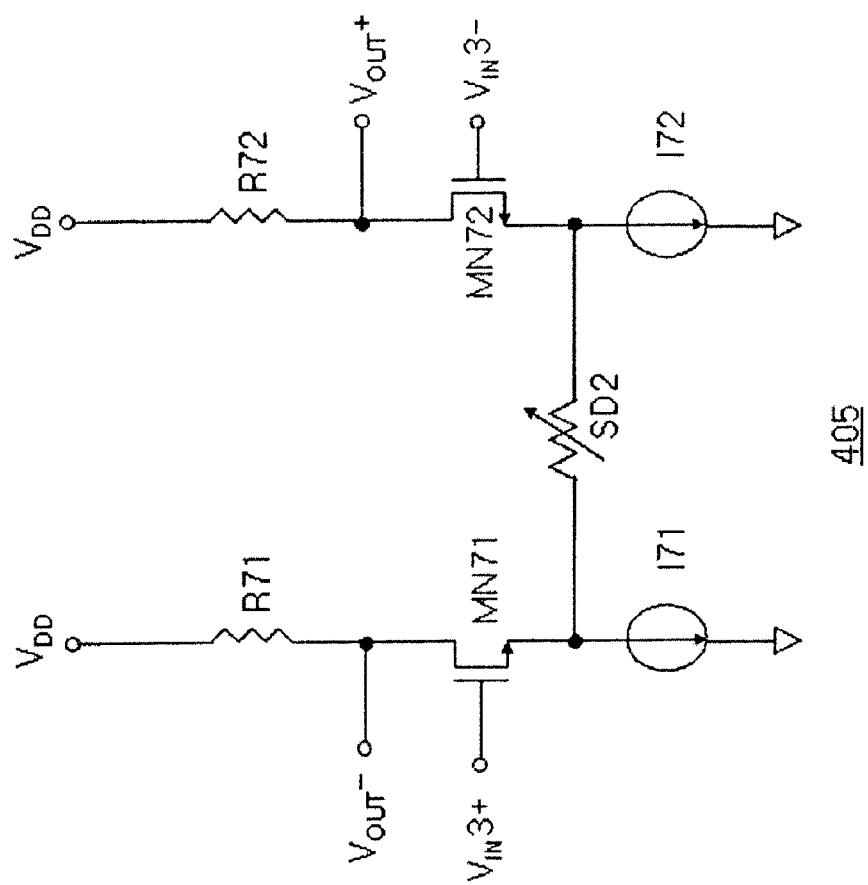
FIG. 12 shows a circuit diagram of the third amplification unit 405 of the variable gain amplifier shown in FIG. 9.

FIG. 12 shows a circuit diagram of the third amplification unit 405 of the variable gain amplifier shown in FIG. 9.

As shown in FIG. 12, the third amplification unit 405 comprises the first and second transistors MN71, MN72, the first and second load impedances R71, R72, the first and second current sources 171, 172, and a source degeneration variable resistor SD2.

Gates of the first and second transistors MN71, MN72 form a first and second input terminals VIN3+, VIN3− of the third amplification unit 405, drains are connected to one terminals of the first and second load impedances R71, R72, and form a first and second output terminals VOUT−, VOUT+, respectively. Moreover, the first and second current sources 171, 172 provide bias currents to sources of the first and second transistors MN71, MN72, respectively.

According to an embodiment of the present invention, the first and second input terminals VIN3+, VIN3− may be connected to the first and second output terminals VOUT2−, VOUT2+ of the second amplification unit 403, respectively.

The source degeneration variable resistor SD2 is connected between sources of the first and second transistors MN71, MN71. Another terminals of the first and second load impedances R71, R72 are connected to a voltage source VDD.

The third amplification unit 405 extends a range of the gain control of the variable gain amplifier by amplifying the signal outputted from the second amplification unit 403, again. The gain and linearity of the third amplification unit 405 are controlled according to the third control signal Vc3.

The amplification circuit, shown in FIG. 12, is well known to a skilled person in the field to which the present invention pertains, and the source degeneration variable resistor SD2 is illustrated above. Accordingly, illustration about construction and operation of the third amplification unit 405 is omitted.

The variable gain amplifier according to the present invention comprises the first to third amplification units 401~405, and each of the amplification units 401~405 amplifies input signals with predetermined gain. Accordingly, an operation range of the variable gain amplifier is extended.

The first amplification unit 403 amplifies input signals in the high and low gain modes according to levels of the input signals. Accordingly, the noise figure and linearity of the variable gain amplifier are improved. Moreover, the variable gain amplifier can operate in a broad band by further comprising the broadband matching unit 530.

The second amplification unit 403 amplifies the signals outputted from the first amplification unit 401 with varying the gain and linearity according to levels of the signals by controlling the resistance values of the source and load degeneration variable resistors SD1, LD1. Accordingly, the linearity of whole system is improved.

The third amplification unit 405 amplifies the signals outputted from the second amplification unit 403 with varying the gain and linearity according to levels of the signals by controlling the resistance value of the source degeneration variable resistor SD1. Accordingly, the range of gain control of the variable gain amplifier is extended, and the linearity of whole system is improved.

In the above description, although the variable gain amplifier is illustrated as it comprises the first to the third amplification units 401~405, the variable gain amplifier may comprise only the first amplification unit 401, or the first amplification unit 401 and one or more amplification units.

More specifically, the variable gain amplifier may perform only two-gain operation if the first amplification unit 401 is used. Moreover, one or more amplification circuits such as the second amplification unit 403, and the third amplification unit 405 may be connected according to embodiments.

Figure 13:
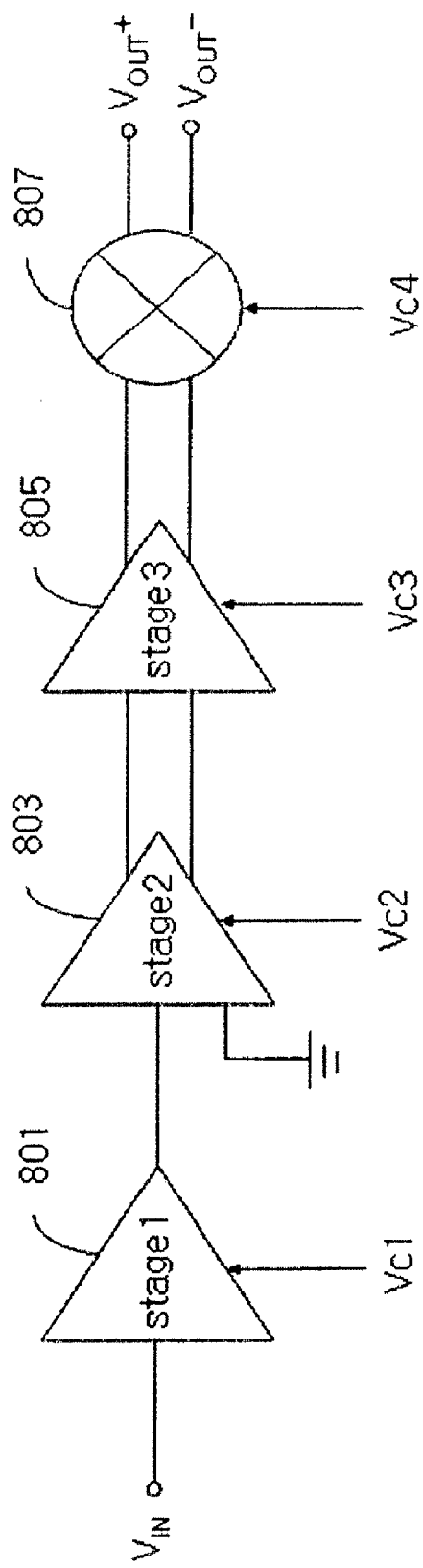
FIG. 13 shows a block diagram of a variable gain amplifier and a mixer according to another embodiment of the present invention.

FIG. 13 shows a block diagram of a variable gain amplifier and a mixer according to another embodiment of the present invention.

As shown in FIG. 13, output terminals of the variable gain amplifier according to the present invention are connected to a switching mixer 807. The variable gain amplifier comprises the first to third amplification units 801~805. Moreover, the gain of the mixer 807 is controlled according to the fourth control signal Vc4.

Figure 14:
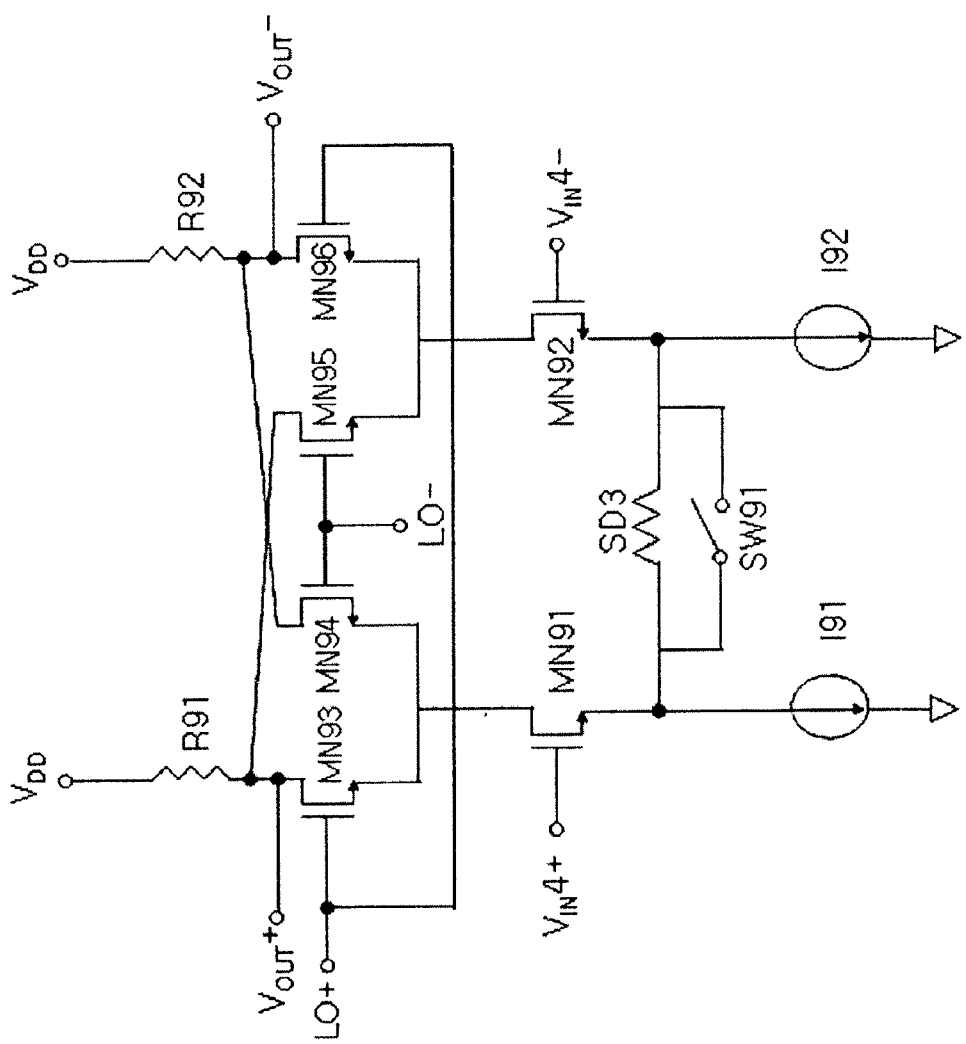
FIG. 14 shows a circuit diagram of the mixer 807 according to an embodiment of the present invention.

FIG. 14 shows a circuit diagram of the mixer 807 according to an embodiment of the present invention.

As shown in FIG. 14, the mixer 807 is embodied by applying concept of the present invention to a conventional Gilbert mixer. The mixer 807 further comprises a parallel connection of a source degeneration resistor SD3 and switch SW61 connected between sources of the first and second transistors MN61, MN61.

In other words, the gain of the mixer 807 can be controlled according to power level of a differential input signal applied between input terminals VIN4+, VIN4− by controlling the switch SW61. More specifically, when power level of the input signal is high, the switch SW61 is open so as to decreasing the gain. Accordingly, linearity of the mixer 807 is improved by the source degeneration resistor SD3. On the other hand, when power level of the input signal is low, the switch SW61 is closed so as to increasing the gain. Accordingly, gain characteristic of the mixer 807 is improved.

In the embodiment shown in FIG. 13 and FIG. 14, the variable gain amplifier amplifies a input signal thorough the first to the third amplification units 801~805 with controlling the gain, and the mixer 807 amplifies the signal outputted from the variable gain amplifier again, and mixes an amplified signal with local signals applied between terminals LO+, LO−.

While only selected embodiment have been chosen to illustrate the present invention, it will be apparent to those skilled in the art from this disclosure that various changes and modification can be made herein without departing from the scope of the invention as define in the appended claims. Furthermore, the foregoing description of the embodiments according to the present invention are provided for illustration only, and not for the purpose of limiting the invention as defined by the appended claims and their equivalents.

INDUSTRIAL APPLICABILITY

According to an embodiment of the present invention, variable gain characteristic of a variable gain amplifier can be improved in a high frequency band.

Moreover, deterioration owing to parasitic capacitance of a transistor for controlling gain of the variable gain amplifier can be minimized.

According to another embodiment of the present invention, linearity of a variable gain amplifier is improved by controlling the gain according to levels of input signals.

Moreover, the variable gain amplifier can operate in a broad band by connecting a broadband matching unit comprising a capacitor, an inductor, and a resistor, to a transistor for amplifying input signals to feedback.

Furthermore, range of gain control can be extended by comprising three amplification units.

What is claimed is:

1. A variable gain amplifier comprising:
   an amplification unit being configured to amplify an input signal applied to an input terminal and to output an amplified signal to an output terminal; and
   a gain control unit being connected between said input and output terminals, and being configured to control gain of said amplification unit, said gain control unit including,
      a variable resistance unit having a resistance value being varied according to a control signal, and
      a broadband matching unit being configured to provide an optimal impedance characteristic to said input terminal of said amplification unit in a broad band, said variable gain resistance unit and said broadband matching unit being connected in parallel, said broadband matching unit being arranged between said input terminal and said output terminal.

2. The variable gain amplifier of claim 1, wherein said amplification unit includes,
   a first transistor having first, second, and third terminals, wherein quantity and direction of current flowing from said second terminal to said third terminal varies dependant on voltage applied to said first terminal, and
   a load impedance that is connected between said second terminal and a voltage source,
   wherein said first terminal of said first transistor is connected to said input terminal, and said second terminal is connected to said output terminal, and said third terminal is grounded.

3. A variable gain amplifier comprising:
   an amplification unit being configured to amplify an input signal applied to an input terminal and to output an amplified signal to an output terminal; and
   a gain control unit being connected between said input and output terminals, and being configured to control gain of said amplification unit, said gain control unit including,
   a variable resistance unit having a resistance value being varied according to a control signal, said variable resistance unit including,
      a transistor having first, second, and third terminals, wherein quantity and direction of current flowing from said second terminal to said third terminal varying dependant on the control voltage applied to said first terminal,
      a first capacitor and a first resistor being connected in series between said input terminal and said third terminal of said transistor, and
      a second capacitor and a second resistor being connected in series between said output terminal and said second terminal of said transistor, and
   a broadband matching unit being configured to provide an optimal impedance characteristic to said input terminal of said amplification unit in a broad band, said variable gain resistance unit and said broadband matching unit being connected in parallel.

4. The variable gain amplifier of claim 3, wherein a resistance value of one of said first and second resistors of said variable resistance unit is substantially zero.

5. The variable gain amplifier of claim 3, wherein a capacitance value of one of said first and second capacitors of said variable resistance unit is substantially infinite.

6. The variable gain amplifier of claim 3, wherein said variable resistance unit includes,
   a transistor having first, second, and third terminals, wherein quantity and direction of current flowing from said second terminal to the third terminal varies dependant on the control voltage applied to said first terminal,
   a first resistor which is connected between said second and third terminals of said transistor,
   a first capacitor which is connected between said input terminal and said third terminal of said transistor, and
   second capacitor and second resistor which are connected between said output terminal and said second terminal of said transistor.

7. The variable gain amplifier of claim 6, wherein a resistance value of said second resistor of said variable resistance unit is substantially zero.

8. The variable gain amplifier of claim 6, wherein a capacitance value of said second capacitor of said variable resistance unit is substantially infinite.

9. A variable gain amplifier comprising:
   an amplification unit being configured to amplify an input signal applied to an input terminal and to output an amplified signal to an output terminal; and
   a gain control unit being connected between said input and output terminals, and being configured to control gain of said amplification unit, said gain control unit including,
      a variable resistance unit having a resistance value being varied according to a control signal, and
      a broadband matching unit being configured to provide an optimal impedance characteristic to said input terminal of said amplification unit in a broad band, said variable gain resistance unit and said broadband matching unit being connected in parallel, said broadband matching unit including a resistor, an inductor, and a capacitor being connected in series.

10. A variable gain amplifier operating in a high gain mode and a low gain mode comprising:
    an amplification unit for amplifying an input signal applied to an input terminal and outputting an amplified signal to an output terminal;
    a broadband matching unit connected between the input terminal and the output terminal for proving an optimal impedance characteristic to the input terminal in the high gain mode;
    an attenuation unit connected between the input terminal and the output terminal for attenuating the input signal and outputting an attenuated signal to the output terminal in the low gain mode; and
    means connected to the input terminal for activating said amplification unit in the high gain mode.

11. The variable gain amplifier of claim 10, wherein said amplification unit comprises,
    a transistor having first, second, and third terminals, wherein quantity and direction of current flowing from the second terminal to the third terminal is varying in dependant on voltage applied to the first terminal, and
    a load impedance which is connected between the second terminal of said transistor and a voltage source, wherein the first terminal of said transistor is connected to the input terminal, and the second terminal is connected to the output terminal, and the third terminal is grounded.

12. The variable gain amplifier of claim 10, wherein said broadband matching unit comprises, a capacitor, an inductor, a resistor, and switch which are connected in series.

13. The variable gain amplifier of claim 10, wherein said attenuation unit comprises a capacitor, a resistor, and a switch, which are connected in series.

14. The variable gain amplifier of claim 11, wherein said means for activating said transistor in the high gain mode comprises a switch and a bias voltage source.

15. The variable gain amplifier of claim 11, wherein said transistor is a MOSFET transistor, and the first terminal is a gate, the second terminal is a drain, and the third terminal is a source.

16. The variable gain amplifier of claim 10, further comprising a second amplification circuit for amplifying a differential input signal applied between first and second input terminals and outputting an amplified signal between first and second output terminals comprising, first and second transistors having first, second, and third terminals, wherein quantity and direction of current flowing from the second terminal to the third terminal is varying in dependant on voltage applied to the first terminal, wherein the first terminals are connected to the first and second input terminals, respectively, and the second terminals are connected to the first and second output terminals, respectively, first and second load impedances connected between the second terminals of said first and second transistors and a voltage source, respectively, first and second current sources for providing currents to the third terminals of said first and second terminals, respectively, a source degeneration variable resistor connected between the third terminals of said first and second transistors, and a load degeneration variable resistor connected between the second terminals of said first and second transistors, wherein one terminal of the first and second input terminals is connected to the output terminal, and another terminal is grounded.

17. The variable gain amplifier of claim 10, further comprising a third amplification circuit for amplifying a differential input signal applied between first and second input terminals and outputting an amplified signal between first and second output terminals comprising, first and second transistors having first, second, and third terminals, wherein quantity and direction of current flowing from the second terminal to the third terminal is varying in dependant on voltage applied to the first terminal, wherein the first terminals are connected to the first and second input terminals, respectively, and the second terminals are connected to the first and second output terminals, respectively, first and second load impedances which are connected between the second terminals of said first and second transistors and a voltage source, respectively, first and second current sources for providing current to the third terminal of said first and second terminals, respectively, and a source degeneration variable resistor which are connected between the third terminals of said first and second transistors, wherein one terminal of the first and second input terminals is connected to the output terminal, and another terminal is grounded.

18. The variable gain amplifier of claim 16, further comprising a third amplification circuit for amplifying a differential input signal applied between first and second input terminals and outputting an amplified signal between first and second output terminals comprising, first and second transistors having first, second, and third terminals, wherein quantity and direction of current flowing from the second terminal to the third terminal is varying in dependant on voltage applied to the first terminal, wherein the first terminals are connected to the first and second input terminals, respectively, and the second terminals are connected to the first and second output terminals, respectively, first and second load impedances which are connected between the second terminals of said first and second transistors and a voltage source, respectively, first and second current sources for providing current to the third terminal of said first and second terminals, respectively, and a source degeneration variable resistor which are connected between the third terminals of said first and second transistors, wherein the first and second input terminals are connected to the first and second output terminals of said second amplification unit.

* * * * *